(12) United States Patent
Guo et al.

(10) Patent No.: US 12,262,522 B2
(45) Date of Patent: Mar. 25, 2025

(54) METHOD FOR FABRICATING SEMICONDUCTOR STRUCTURE, SEMICONDUCTOR STRUCTURE, AND MEMORY

(71) Applicant: CHANGXIN MEMORY TECHNOLOGIES, INC., Hefei (CN)

(72) Inventors: Shuai Guo, Hefei (CN); Mingguang Zuo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 420 days.

(21) Appl. No.: 17/841,681

(22) Filed: Jun. 16, 2022

(65) Prior Publication Data

US 2023/0276609 A1 Aug. 31, 2023

Related U.S. Application Data

(63) Continuation of application No. PCT/CN2022/088294, filed on Apr. 21, 2022.

(30) Foreign Application Priority Data

Feb. 25, 2022 (CN) .......................... 202210178852.4

(51) Int. Cl.
*H10B 12/00* (2023.01)
(52) U.S. Cl.
CPC .................................. *H10B 12/01* (2023.02)

(58) Field of Classification Search
CPC ...................................................... H10B 12/01
See application file for complete search history.

(56) References Cited

U.S. PATENT DOCUMENTS

| | | | | |
|---|---|---|---|---|
| 2022/0344363 A1* | 10/2022 | Lee | ......................... | H10B 41/27 |
| 2022/0367509 A1* | 11/2022 | Yamazaki | ............. | H01L 29/786 |
| 2022/0375521 A1* | 11/2022 | Yamazaki | .............. | H10B 41/27 |

FOREIGN PATENT DOCUMENTS

CN  204390687 U  6/2015

\* cited by examiner

*Primary Examiner* — Christine A Enad
(74) *Attorney, Agent, or Firm* — Kilpatrick Townsend & Stockton LLP

(57) ABSTRACT

Embodiments provide method for fabricating a semiconductor structure, and a semiconductor structure. The method includes: providing a substrate, a thin-film stack structure being formed on the substrate; forming a first groove and a second groove in the thin-film stack structure, and forming write transistors in the first groove, the second groove extending along a first direction, and the second groove being positioned between adjacent two of the write transistors in a second direction; removing a part of the thin-film stack structure by etching using the second groove to form a first hole and a second hole respectively, forming a write word line in the first hole, and forming a write bit line in the second hole; forming a first via on an upper surface of the thin-film stack structure, and forming a storage node in the first via; and forming a read transistor, a read bit line and a lead.

15 Claims, 13 Drawing Sheets

METHOD FOR FABRICATING SEMICONDUCTOR STRUCTURE, SEMICONDUCTOR STRUCTURE, AND MEMORY

CROSS-REFERENCE TO RELATED APPLICATION

The present disclosure is a continuation of PCT/CN2022/088294, filed on Apr. 21, 2022, which claims priority to Chinese Patent Application No. 202210178852.4 titled "METHOD FOR FABRICATING SEMICONDUCTOR STRUCTURE, SEMICONDUCTOR STRUCTURE, AND MEMORY" and filed on Feb. 25, 2022, the entire contents of which are incorporated herein by reference.

TECHNICAL FIELD

The present disclosure relates to the field of semiconductor technology, and more particularly, to a method for fabricating a semiconductor structure, a semiconductor structure, and a memory.

BACKGROUND

With the development of the semiconductor industry, to maximize profits for enterprises, how to achieve maximum storage density by designing new structures is an important research topic for those skilled in the art. However, in an existing dynamic random access memory (DRAM) structure provided with one transistor and one capacitor (1T1C), further size reduction of the DRAM and realization of three-dimensional stacking of a capacitor structure are limited by a size of the capacitor structure, making it difficult to achieve higher storage density.

SUMMARY

In one aspect of the present disclosure, there is provided a method for fabricating a semiconductor structure. The method includes: providing a substrate, on which a thin-film stack structure is formed; forming a first groove and a second groove in the thin-film stack structure, and forming write transistors in the first groove, the second groove extending along a first direction, and the second groove being positioned between adjacent two of the write transistors in a second direction; removing a part of the thin-film stack structure by etching using the second groove to form a first hole and a second hole respectively, forming a write word line in the first hole, and forming a write bit line in the second hole; forming a first via on an upper surface of the thin-film stack structure, the write transistor being exposed to a bottom of the first via, and forming a storage node in the first via; forming a read transistor over the thin-film stack structure; and forming a read bit line and a lead over the read transistor to obtain the semiconductor structure.

In another aspect of the present disclosure, there is provided a semiconductor structure, which includes: a substrate and a thin-film stack structure positioned over the substrate; a write transistor penetrating through the thin-film stack structure; a write word line and a write bit line arranged in the thin-film stack structure, respectively; a storage node arranged above the thin-film stack structure, a bottom of the storage node being in contact with the write transistor; a read transistor positioned above the thin-film stack structure; and a read bit line and a lead arranged above the read transistor, respectively.

In yet another aspect of the present disclosure, a memory is provided, where the memory includes at least two layers of the stacked semiconductor structure proposed in the present disclosure.

DETAILED DESCRIPTION

Exemplary embodiments will now be described more fully with reference to the accompanying drawings. However, the exemplary embodiments can be implemented in a variety of forms and should not be construed as being limited to the embodiments set forth herein. Rather, these embodiments are provided such that the present disclosure will be thorough and complete and will fully convey the concepts of exemplary embodiments to those skilled in the art. Throughout the drawings, similar reference signs indicate the same or similar structures, and thus their detailed descriptions are omitted.

Figure 1:
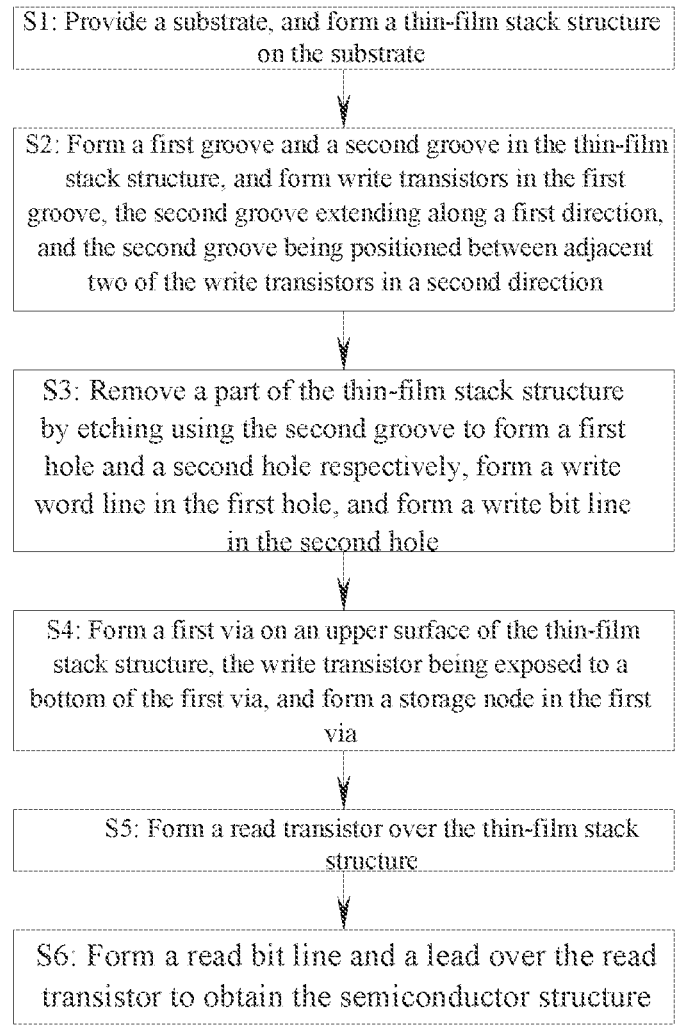
FIG. 1 is a schematic flow chart showing a method for fabricating a semiconductor structure according to an exemplary embodiment.

Referring to FIG. 1, a schematic flow chart of a method for fabricating a semiconductor structure proposed by the present disclosure is typically illustrated. In this exemplary embodiment, the method for fabricating a semiconductor structure proposed in the present disclosure is described by taking an example where this method is applied to fabrication processes of DRAM having an ultra-high storage density. It is readily comprehensible to those skilled in the art that to apply relevant design of the present disclosure to other types of semiconductor structures or other processes, various modifications, additions, substitutions, deletions or other variations are made to the following embodiments, and these variations still fall within the scope of the principle of the method for fabricating a semiconductor structure proposed in the present disclosure.

As shown in FIG. 1, in this embodiment, the method for fabricating a semiconductor structure proposed by the present disclosure includes following steps:

Step S1: providing a substrate 110, and forming a thin-film stack structure 120 on the substrate 110;

Step S2: forming a first groove G1 and a second groove G2 in the thin-film stack structure 120, and forming write transistors 130 in the first groove G1, the second groove G2 extending along a first direction X, and the second groove G2 being positioned between adjacent two of the write transistors 130 in a second direction Y;

Step S3: removing a part of the thin-film stack structure 120 by etching using the second groove G2 to form a first hole H1 and a second hole H2 respectively, forming a write word line 141 in the first hole H1, and forming a write bit line 142 in the second hole H2;

Step S4: forming a first via V1 on an upper surface of the thin-film stack structure 120, the write transistor 130 being exposed to a bottom of the first via V1, and forming a storage node 200 in the first via V1;

Step S5: forming a read transistor 700 over the thin-film stack structure 120; and Step S6: forming a read bit line 720 and a lead 730 over the read transistor 700 to obtain the semiconductor structure.

By means of the above process design, a 2-transistor-0-capacitor (2T0C) DRAM structure is implemented for the semiconductor structure fabricated by the method for fabricating a semiconductor structure proposed in the present disclosure. Compared with an existing 1T1C DRAM structure, the present disclosure can achieve maximization of the storage density by means of the capacitor-free semiconductor structure.

Referring to FIGS. 2 to 42, FIGS. 2 to 42 respectively typically illustrate schematic structural diagrams of the semiconductor structure under several steps in the method for fabricating a semiconductor structure as shown in FIG. 1. Main process steps of the method for fabricating a semiconductor structure proposed by the present disclosure will be described below with reference to the above drawings.

Figure 2:
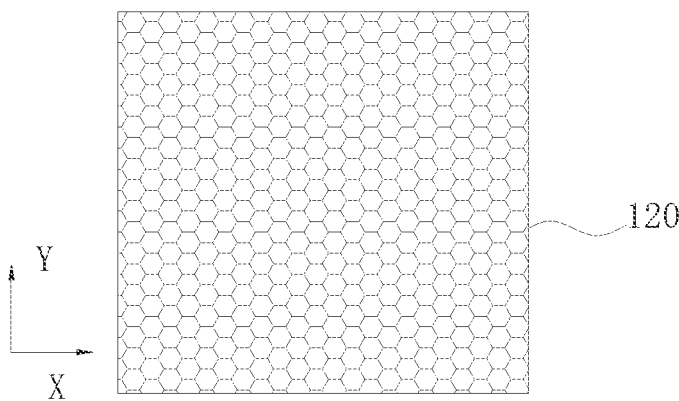
FIGS. 2 to 43 respectively show schematic structural diagrams of a semiconductor structure under several steps in the method for fabricating a semiconductor structure as shown in FIG. 1.
Figure 3:
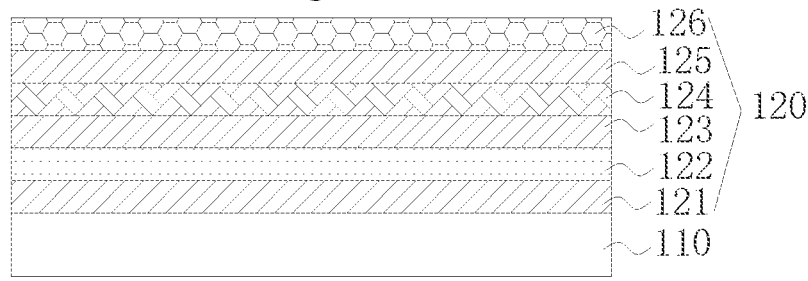
Figure 4:
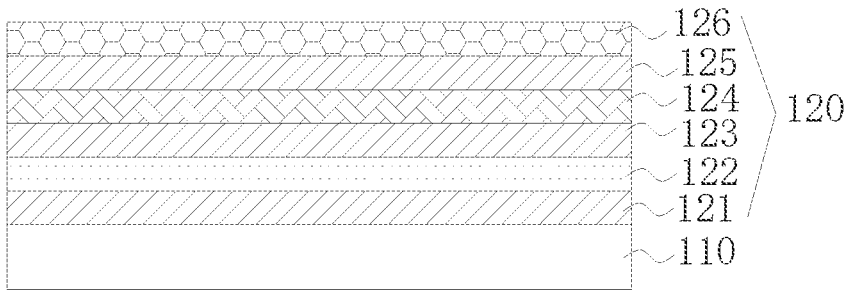

As shown in FIGS. 2 to 4, FIG. 2 typically illustrates a vertical view of the semiconductor structure in Step S1; FIG. 3 typically illustrates a schematic structural diagram of the semiconductor structure along the first direction X in Step S1; and FIG. 4 typically illustrates a schematic structural diagram of the semiconductor structure along the second direction Y in Step S1.

In one embodiment of the present disclosure, for Step S1 in the present disclosure, a first insulating layer 121, a first sacrificial layer 122, a second insulating layer 123, a second sacrificial layer 124, a third insulating layer 125 and a dielectric layer 126 are formed on the substrate 110 in sequence. That is, the first insulating layer 121 is formed on a surface of the substrate 110, the first sacrificial layer 122 is formed on a surface of the first insulating layer 121, the second insulating layer 123 is formed on a surface of the first sacrificial layer 122, the second sacrificial layer 124 is formed on a surface of the second insulating layer 123, the third insulating layer 125 is formed on a surface of the second sacrificial layer 124, and the dielectric layer 126 is formed on a surface of the third insulating layer 125. In other words, an insulating layer is respectively formed between the substrate 110, the first sacrificial layer 122, the second sacrificial layer 124, and the dielectric layer 126.

In one embodiment of the present disclosure, a material of the first sacrificial layer 122 may include silicon nitride ($Si_3N_4$).

In one embodiment of the present disclosure, a material of the second sacrificial layer 124 may include polysilicon (Poly), such as undoped polysilicon.

In one embodiment of the present disclosure, a material of the dielectric layer 126 may include silicon oxynitride (SiON).

In one embodiment of the present disclosure, a material of the first insulating layer 121 may include silicon oxide ($SiO_2$).

In one embodiment of the present disclosure, a material of the second insulating layer 123 may include silicon oxide.

In one embodiment of the present disclosure, a material of the third insulating layer 125 may include silicon oxide.

Figure 5:
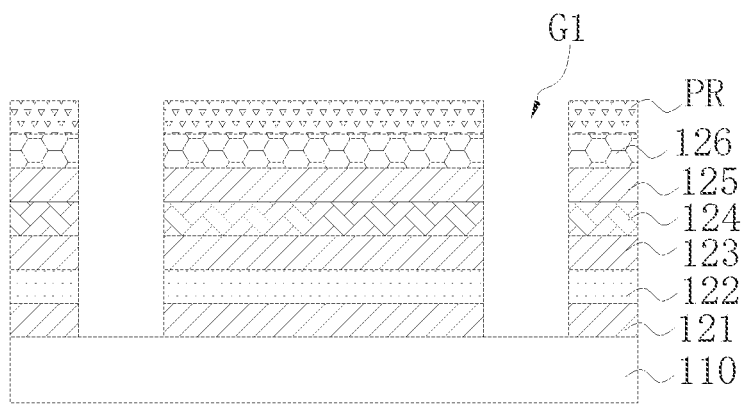
Figure 6:
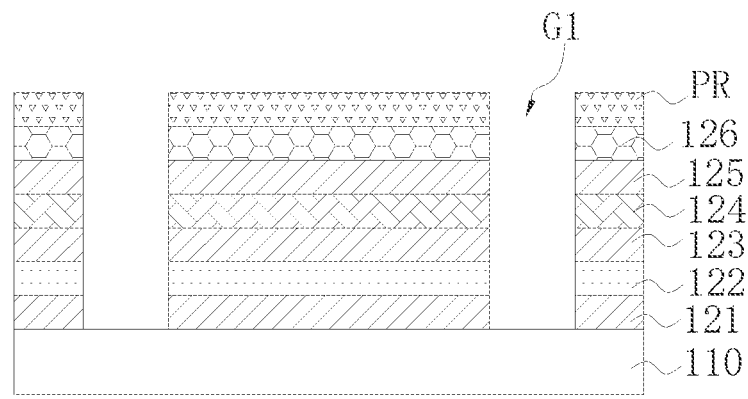

As shown in FIG. 5 and FIG. 6, FIG. 5 typically illustrates a schematic structural diagram of the semiconductor structure along the first direction X in the step of "forming a first groove G1 in the thin-film stack structure 120"; and FIG. 6 typically illustrates a schematic structural diagram of the semiconductor structure along the second direction Y in the above step.

In one embodiment of the present disclosure, for the step of "forming a first groove G1 in the thin-film stack structure 120" in the present disclosure, penetrative first grooves G1 are formed by etching the thin-film stack structure 120, and these first grooves G1 are arranged in an array. A photo resist (PR) may be deposited onto the surface of the thin-film stack structure 120, i.e., the surface of the dielectric layer 126. Next, the photo resist is exposed and patterned, such that a photolithographic opening is formed by means of the photo resist exposed. Next, the first groove G1 is formed by etching by means of the photo resist patterned, and then rest of the photo resist is removed after the first groove G1 is formed by etching. Hereby, a top of the first groove G1 is opened on the surface of the dielectric layer 126, and the etching of the first groove G1 is stopped on the surface of the substrate 110, such that the substrate 110 is partially exposed to a bottom of the first groove G1. That is, a bottom wall of the first groove G1 is defined by the exposed substrate 110.

Figure 7:
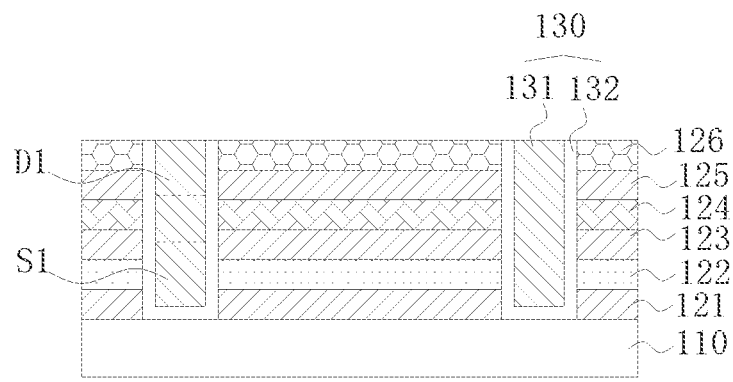
Figure 8:
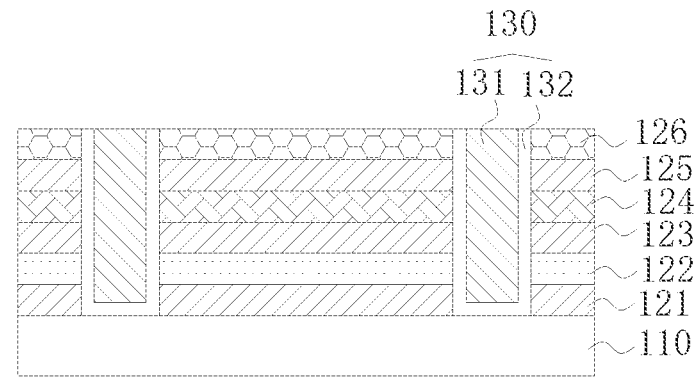

As shown in FIG. 7 and FIG. 8, FIG. 7 typically illustrates a schematic structural diagram of the semiconductor structure along the first direction X in the step of "forming a write transistor 130 in the first groove G1"; and FIG. 8 typically illustrates a schematic structural diagram of the semiconductor structure along the second direction Y in the above step.

In one embodiment of the present disclosure, for the step of "forming a write transistor 130 in the first groove G1" in the present disclosure, a transistor material is deposited into the first groove G1 to form a first channel layer 131. As shown in FIG. 7, in a direction perpendicular to the substrate 110, the first channel layer 131 away from an upper surface of the second sacrificial layer 124 forms a first drain D1 of the write transistor 130 by means of ion doping, and the first channel layer 131 away from a lower surface of the second sacrificial layer 124 forms a first source S1 of the write transistor 130 by means of ion doping, where the first source S1 has more doped ions than the first drain D1, and the doped ions may be boron or phosphorus. In this embodiment, the first channel layer 131 between the first source S1 and the first drain D1 may serve as a channel region. A top of the first channel layer 131 is exposed to the top opening of the first groove G1.

In one embodiment of the present disclosure, the transistor material for forming the first channel layer 131 may include metal oxide.

In some embodiments, the material for forming the first channel layer 131 may be indium gallium zinc oxide (IGZO).

In one embodiment of the present disclosure, when the transistor material is deposited into the first groove G1, the transistor material not only fills up the first groove G1 but also covers the surface of the thin-film stack structure 120 (i.e., the surface of the dielectric layer 126). Hereby, for the step of "forming a write transistor 130 in the first groove G1", after the deposition of the transistor material, the transistor material covering the surface of the thin-film stack structure 120 may be removed by means of, for example, chemical mechanical polishing (CMP), and the top of the first channel layer 131 formed may be flush with the surface of the dielectric layer 126.

As shown in FIG. 7 and FIG. 8, in one embodiment of the present disclosure, the step of "forming a write transistor 130 in the first groove G1" may include:

forming a barrier layer 132 on a sidewall and the bottom wall of the first groove G1; and forming the first channel layer 131 in the first groove G1; where the barrier layer 132 and the first channel layer 131 jointly constitute the write transistor 130.

In some embodiments, as shown in FIG. 7 and FIG. 8, in one embodiment of the present disclosure, for the step of "forming a barrier layer 132 on a sidewall and the bottom wall of the first groove G1" in the present disclosure, the barrier layer 132 is formed by depositing a barrier material on the sidewall and the bottom wall (i.e., the surface of the substrate 110 exposed to the bottom of the first groove G1) of the first groove G1. Furthermore, the first channel layer 131 formed in the first groove G1 is filled in remaining space of the first groove G1. The barrier layer 132 isolates the first channel layer 131 from the substrate 110 (for example, the substrate 110 exposed to the bottom of the first groove G1) and the thin-film stack structure 120 (for example, comprising the first insulating layer 121, the first sacrificial layer 122, the second insulating layer 123, the second sacrificial layer 124, the third insulating layer 125, and the dielectric layer 126).

In one embodiment of the present disclosure, the barrier material for forming the barrier layer 132 may be different from the material of the second sacrificial layer 124, including but not limited to, such as polysilicon and elements doped with boron (B), for example.

In one embodiment of the present disclosure, the deposition of the barrier material may employ an atomic layer deposition process.

In one embodiment of the present disclosure, when the barrier material is deposited into the first groove G1, the barrier material not only covers the sidewall and the bottom wall of the first groove G1, but also covers the surface of the thin-film stack structure 120 (i.e., the surface of dielectric layer 126). Hereby, for the step of "forming a barrier layer 132 on a sidewall and the bottom wall of the first groove G1", after the barrier material is deposited, the barrier material covering the surface of the thin-film stack structure 120 may be removed by means of, for example, chemical mechanical polishing; and the top of the barrier layer 132 formed can be flush with the surface of the thin-film stack structure 120.

Figure 9:
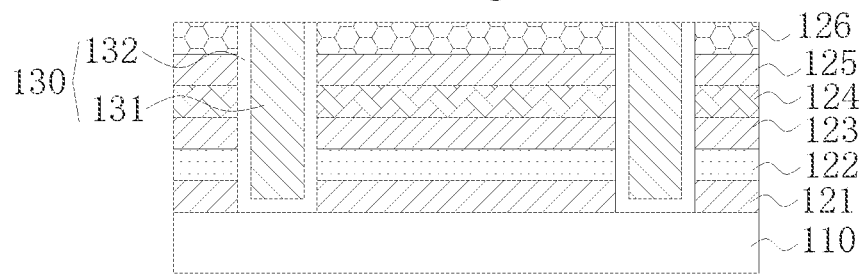
Figure 10:
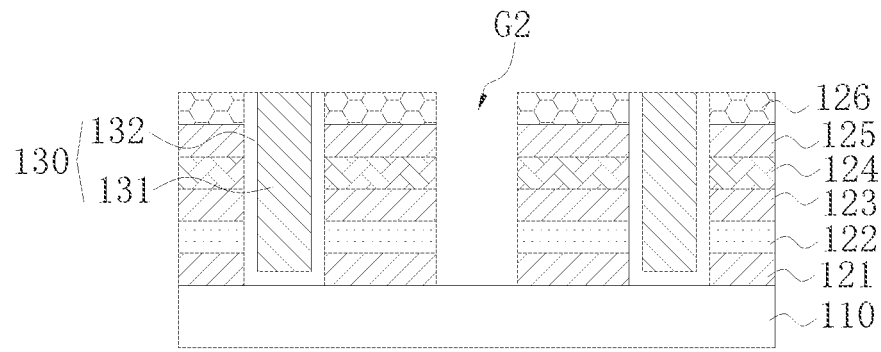

As shown in FIG. 9 and FIG. 10, FIG. 9 typically illustrates a schematic structural diagram of the semiconductor structure along the first direction X in the step of "forming a second groove G2 in the thin-film stack structure 120"; and FIG. 10 typically illustrates a schematic structural diagram of the semiconductor structure along the second direction Y in the above step.

In one embodiment of the present disclosure, for the step of "forming a second groove G2 in the thin-film stack structure 120" in the present disclosure, a penetrative second groove G2 is formed by etching the thin-film stack structure 120, and the second groove G2 is positioned between adjacent two of the first grooves G1 in the second direction Y. A photo resist may be deposited onto the surface of the thin-film stack structure 120, i.e., the surface of the dielectric layer 126. Next, the photo resist is exposed and patterned, such that a photolithographic opening is formed by means of the photo resist exposed. Next, the second groove G2 is formed by etching by means of the photo resist patterned, and then rest of the photo resist is removed after the second groove G2 is formed by etching. Hereby, a top of the second groove G2 is opened on the surface of the dielectric layer 126, and the etching of the second groove G2 is stopped on the surface of the substrate 110, such that the substrate 110 is partially exposed to a bottom of the second groove G2. That is, a bottom wall of the second groove G2 is defined by the exposed substrate 110.

As shown in FIGS. 11 to 18, in one embodiment of the present disclosure, the step of "forming a write word line 141 in the first hole H1" may include:

removing a part of the thin-film stack structure 120 by etching using the second groove G2 to form the first hole H1, the first hole H1 exposing a part of the barrier layer 132;

oxidizing the exposed part of the barrier layer 132 to form a first gate oxide layer 133; and forming the write word line 141 in the first hole H1 by means of the second groove G2.

Figure 11:
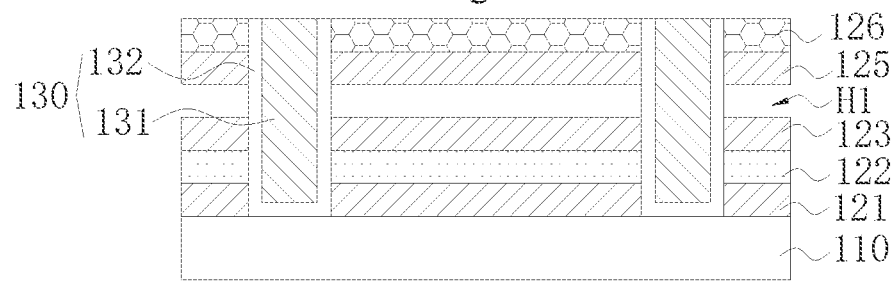
Figure 12:
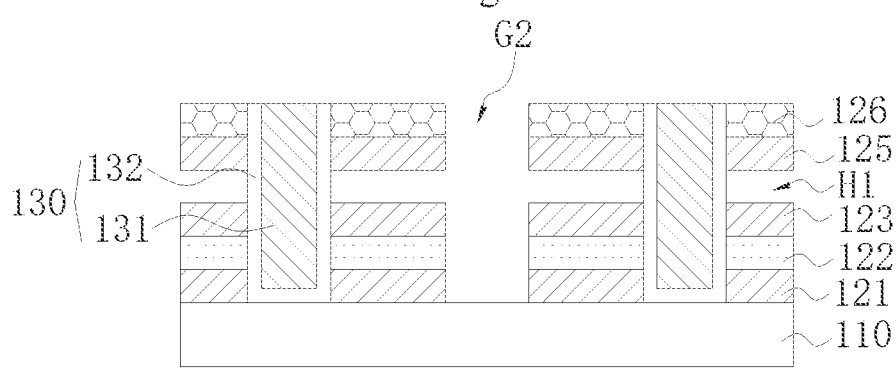

As shown in FIG. 11 and FIG. 12, FIG. 11 typically illustrates a schematic structural diagram of the semiconductor structure along the first direction X in the step of "removing a part of the thin-film stack structure 120 by etching using the second groove G2 to form the first hole H1"; and FIG. 12 typically illustrates a schematic structural diagram of the semiconductor structure along the second direction Y in the above step.

In one embodiment of the present disclosure, for the step of "removing a part of the thin-film stack structure 120 by etching using the second groove G2 to form the first hole H1" in the present disclosure, a partial structure of the thin-film stack structure 120 is removed by means of etching. When the thin-film stack structure 120 includes the first sacrificial layer 122 and the second sacrificial layer 124, the above-mentioned "partial structure" may be, for example, the second sacrificial layer 124, to form the first hole H1. That is, a formation region of the first hole H1 is a formation region of the second sacrificial layer 124 in the thin-film stack structure 120. In some embodiments, the second groove G2 penetrates through the thin-film stack structure 120. That is, the second sacrificial layer 124 is partially exposed to a sidewall of the second groove G2. Therefore, in the present disclosure, the second groove G2 can be used as an etching window to remove the second sacrificial layer 124 stacked in a middle of the thin-film stack structure 120. In addition, the material of the second sacrificial layer 124 is different from that of the barrier layer 132. Therefore, the second sacrificial layer 124 may be removed in one etching process by controlling an etching selectivity, and the barrier layer 132 exposed to the first hole H1 is retained. Exemplarily, the material of the second sacrificial layer 124 may be polysilicon, the barrier layer 132 may be boron-doped polysilicon, and a wet etching solution includes tetramethyl ammonium hydroxide (TMAH). The second sacrificial layer 124 is removed by means of a wet etching process using the second groove G2 as the etching window, but the TMAH does not react with the boron-doped polysilicon. In this way, removing the second sacrificial layer 124 based on selective etching is achieved without etching the barrier layer 132 exposed to the first hole H1.

Figure 13:
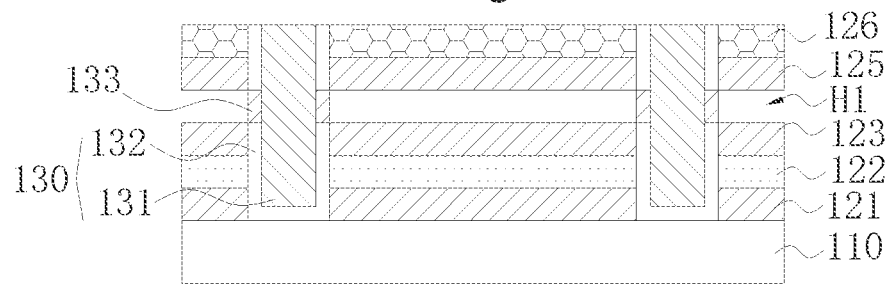
Figure 14:
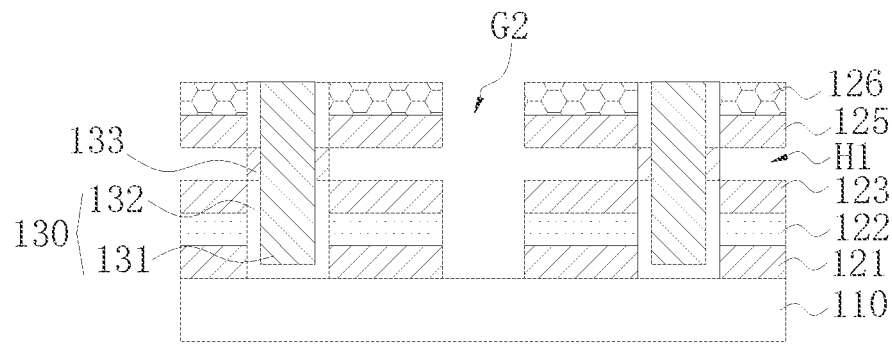

As shown in FIG. 13 and FIG. 14, FIG. 13 typically illustrates a schematic structural diagram of the semiconductor structure along the first direction X in the step of "forming a first gate oxide layer 133"; and FIG. 14 typically illustrates a schematic structural diagram of the semiconductor structure along the second direction Y in the above step.

In one embodiment of the present disclosure, for the step of "forming a first gate oxide layer 133", the part of the barrier layer 132 exposed to the first hole H1 may be oxidized, such that this part of the barrier layer 132 is oxidized to form the first gate oxide layer 133. That is, the first gate oxide layer 133 formed is exposed to the first hole H1.

In one embodiment of the present disclosure, taking an example where the material of the barrier layer 132 includes the boron-doped polysilicon, the material of the first gate oxide layer 133 formed by oxidizing the barrier layer 132 may include silicon oxide.

In one embodiment of the present disclosure, in the direction perpendicular to the substrate 110, a width size of the first gate oxide layer 133 may be equal to that of the first hole H1. In some embodiments, in the direction perpendicular to the substrate 110, the width size of the first gate oxide layer 133 may also be greater than that of the first hole H1. Bonding strength of the first gate oxide layer 133 formed by oxidizing the barrier layer 132 in the barrier layer 132 is improved to ensure structural stability of a device.

Figure 15:
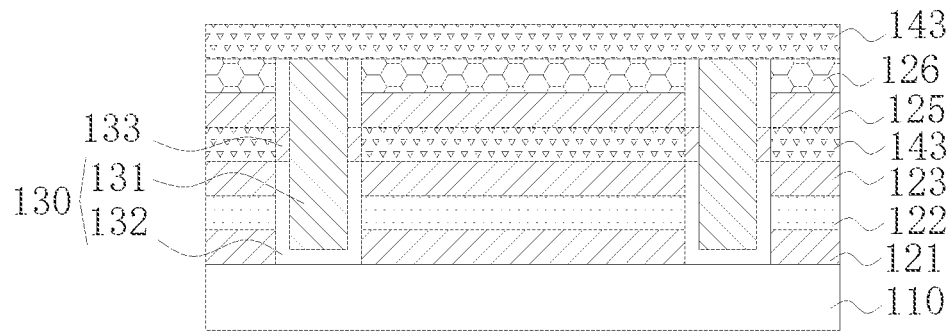
Figure 16:
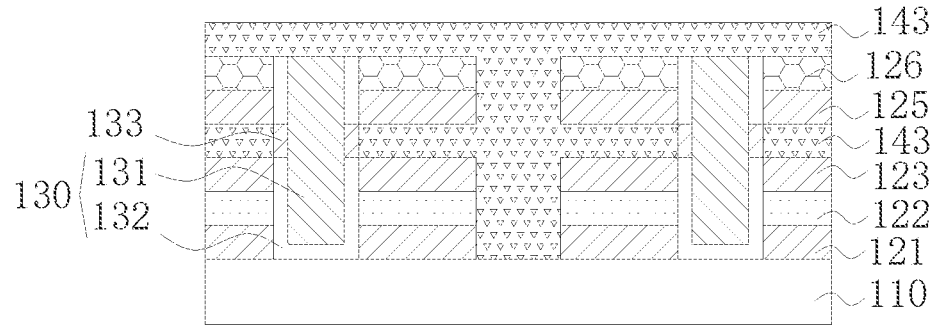

As shown in FIG. 15 and FIG. 16, FIG. 15 typically illustrates a schematic structural diagram of the semiconductor structure along the first direction X in the step of "forming a write word line 141 in the first hole H1"; and FIG. 16 typically illustrates a schematic structural diagram of the semiconductor structure along the second direction Y in the above step.

In one embodiment of the present disclosure, the step of "forming a write word line 141 in the first hole H1" may also include following steps:
   filling a first conductive material 143 into the first hole H1 and the second groove G2, the first conductive material 143 also covering the surface of the thin-film stack structure 120; and
   removing the first conductive material 143 filled into the second groove G2 and covering the surface of the thin-film stack structure 120, rest of the first conductive material 143 in the first hole H1 forming the write word line 141.

Figure 17:
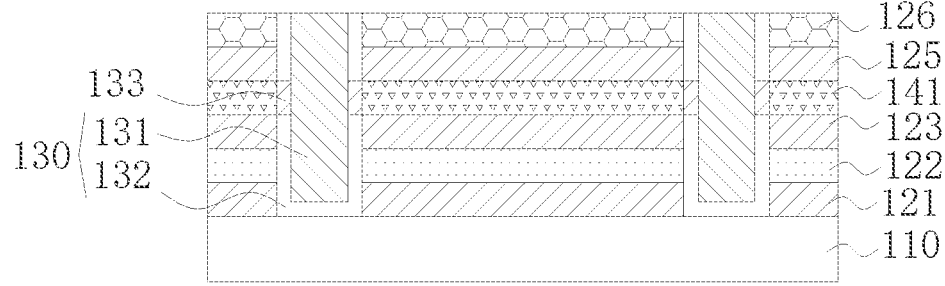
Figure 18:
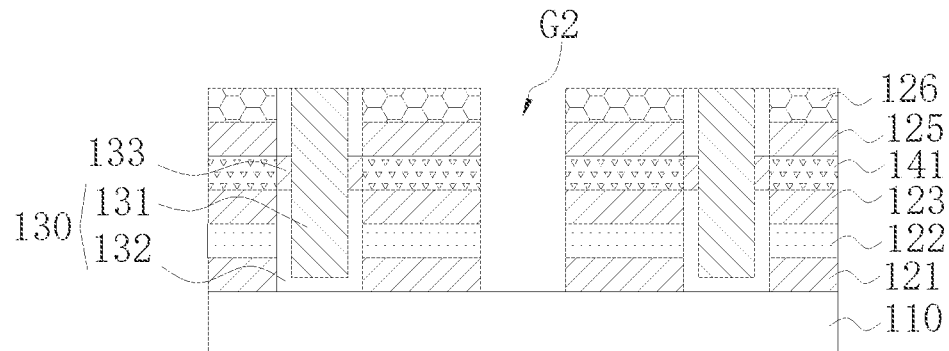

The second groove G2 is communicated to the first hole H1 inside the thin-film stack structure 120. Therefore, the second groove G2 may be used as an inlet of the first conductive material 143 in the above deposition process, such that the first conductive material 143 can be deposited into the first hole H1, and the first conductive material 143 is also deposited into the second groove G2 and on the surface of the thin-film stack structure 120 (i.e., the surface of the dielectric layer 126). On this basis, as shown in FIG. 17 and FIG. 18, after the deposition of the first conductive material 143 is completed, the first conductive material 143 filled into the second groove G2 and covering the surface of the thin-film stack structure 120 may be removed by means of but not limited to, for example, an etch back process. Hence, rest of the first conductive material 143 is filled into the first hole H1 to form the write word line 141, and the first gate oxide layer 133 is arranged between the write word line 141 and the first channel layer 131 of the write transistor 130.

In one embodiment of the present disclosure, the first conductive material 143 forming the write word line 141 may include at least one of tungsten (W), aluminum (Al), copper (Cu), nickel (Ni), or cobalt (Co).

As shown in FIGS. 19 to 24, in one embodiment of the present disclosure, the step of "forming a write bit line 142 in the second hole H2" may include:
   removing the part of the barrier layer 132 exposed to the second hole H2 by etching by means of the second hole H2, to expose a part of the first channel layer 131; and
   forming the write bit line 142 in the second hole H2, the write bit line 142 being in contact with the first channel layer 131.

Figure 19:
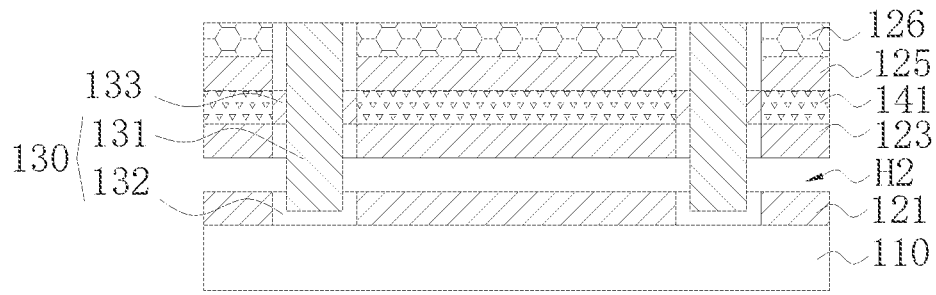
Figure 20:
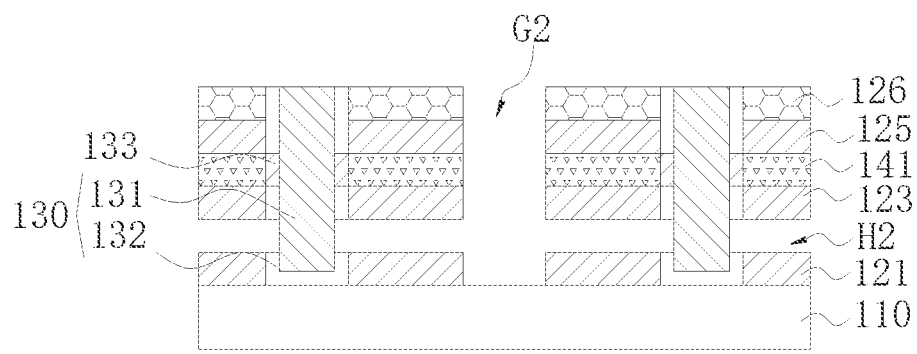

As shown in FIG. 19 and FIG. 20, FIG. 19 typically illustrates a schematic structural diagram of the semiconductor structure along the first direction X in the step of "removing a part of the thin-film stack structure 120 by etching using the second groove G2 to form the second hole H2"; and FIG. 20 typically illustrates a schematic structural diagram of the semiconductor structure along the second direction Y in the above step.

In one embodiment of the present disclosure, the step of "removing a part of the thin-film stack structure 120 by etching using the second groove G2 to form the second hole H2" may include:
   removing the part of the barrier layer 132 exposed to the second hole H2 by etching by means of the second hole H2, to expose a part of the first channel layer 131; and
   forming the write bit line 142 in the second hole H2, the write bit line 142 being in contact with the first channel layer 131.

In the present disclosure, a partial structure of the thin-film stack structure 120 is removed by means of etching. When the thin-film stack structure 120 includes the first sacrificial layer 122 and the second sacrificial layer 124, the above-mentioned "partial structure" may be, for example, the first sacrificial layer 122, to form the second hole H2. That is, a formation region of the second hole H2 is a formation region of the first sacrificial layer 122 in the thin-film stack structure 120. In some embodiments, the second groove G2 penetrates through the thin-film stack structure 120. That is, the first sacrificial layer 122 is partially exposed to a sidewall of the second groove G2. Therefore, in the present disclosure, the second groove G2 can be used as the etching window to remove the first sacrificial layer 122 stacked in the middle of the thin-film stack structure 120. In addition, the material of the first sacrificial layer 122 is different from that of the barrier layer 132. Therefore, the first sacrificial layer 122 may be removed in one etching process by controlling the etching selectivity, and the part of the barrier layer 132 exposed to second hole H2 is removed, such that a part of the sidewall of the first channel layer 131 is exposed to the second hole H2.

Figure 21:
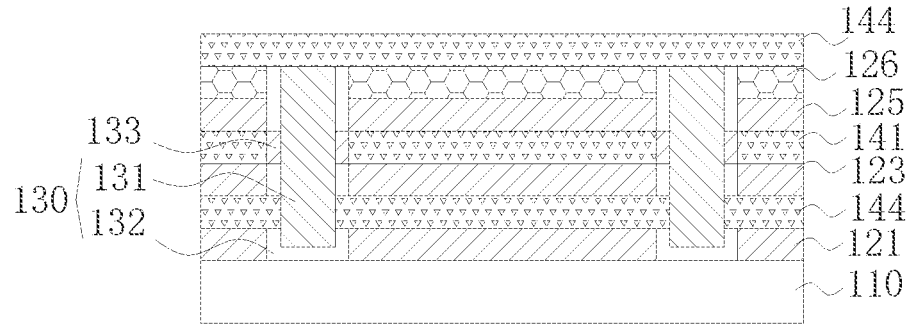
Figure 22:
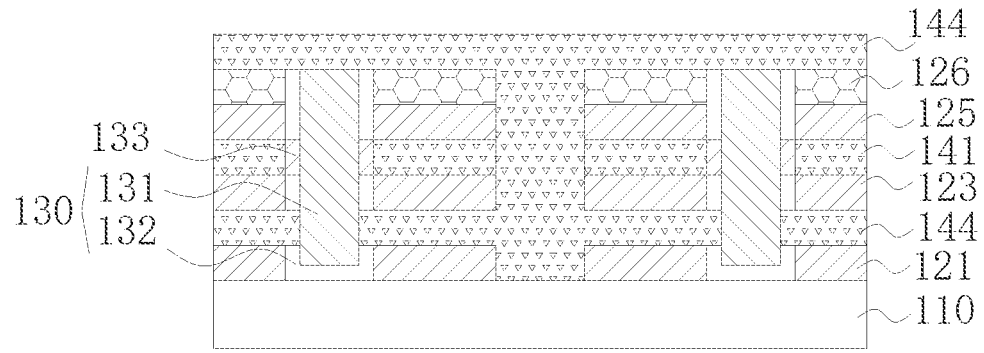

As shown in FIG. 21 and FIG. 22, FIG. 21 typically illustrates a schematic structural diagram of the semiconductor structure along the first direction X in the step of "forming a write bit line 142 in the second hole H2"; and FIG. 22 typically illustrates a schematic structural diagram of the semiconductor structure along the second direction Y in the above step.

In one embodiment of the present disclosure, the step of "forming a write bit line 142 in the second hole H2" may also include following steps:
   filling a second conductive material 144 into the second hole H2 and the second groove G2, the second conductive material 144 also covering the surface of the thin-film stack structure 120; and
   removing the second conductive material 144 filled into the second groove G2 and covering the surface of the thin-film stack structure 120, rest of the second conductive material 144 in the second hole H2 forming the write bit line 142.

Figure 23:
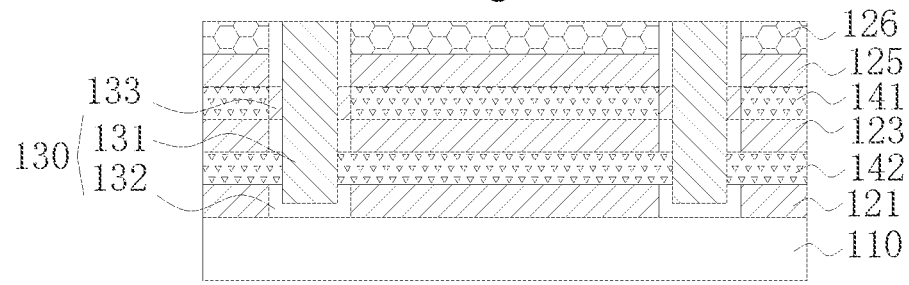
Figure 24:
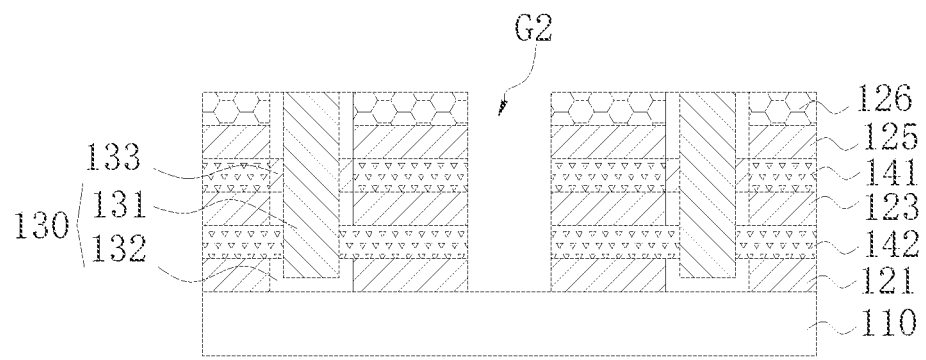

The second groove G2 is communicated to the second hole H2 inside the thin-film stack structure 120. Therefore, the second groove G2 may be used as an inlet of the second conductive material 144 in the above deposition process, such that the second conductive material 144 can be deposited into the second hole H2, and the second conductive material 144 is also deposited into the second groove G2 and on the surface of the thin-film stack structure 120 (i.e., the surface of the dielectric layer 126). On this basis, as shown in FIG. 23 and FIG. 24, after the deposition of the second conductive material 144 is completed, the second conductive material 144 filled into the second groove G2 and covering the surface of the thin-film stack structure 120 may be removed by means of but not limited to, for example, an etch back process. Hereby, rest of the second conductive material 144 is filled into the second hole H2 to form the write bit line 142, and the first channel layer 131 of the write transistor 130 exposed to the second hole H2 is in contact with the write bit line 142.

In one embodiment of the present disclosure, the second conductive material 144 forming the write bit line 142 may include at least one of tungsten (W), aluminum (Al), copper (Cu), nickel (Ni), or cobalt (Co).

Figure 25:
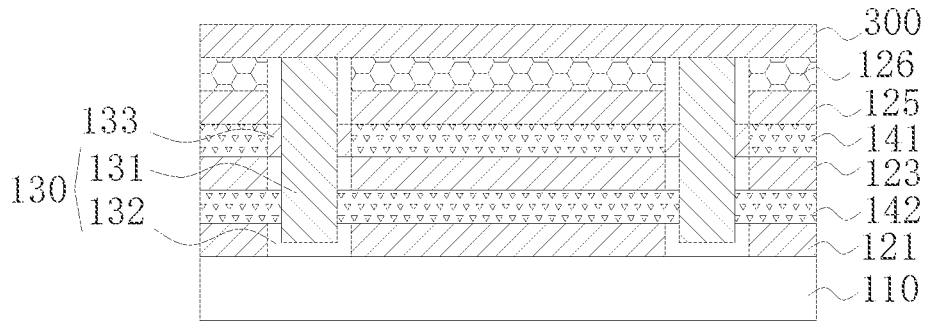
Figure 26:
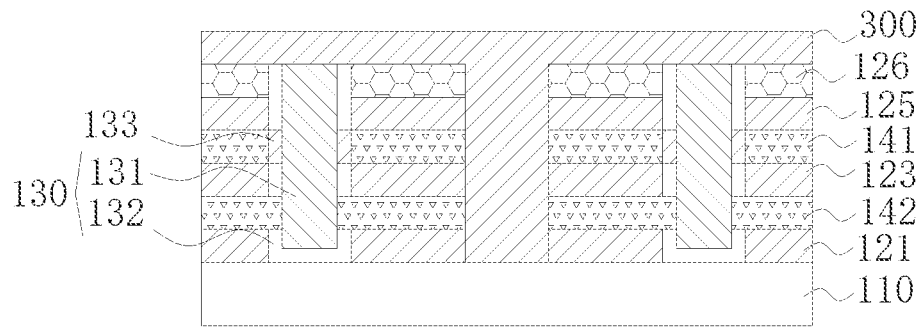

As shown in FIG. 25 and FIG. 26, in one embodiment of the present disclosure, before Step S4, the method may also include:

forming a fourth insulating layer 300 on the surface of the thin-film stack structure 120, the fourth insulating layer 300 filling up the second groove G2.

As shown in FIG. 25 and FIG. 26, FIG. 25 typically illustrates a schematic structural diagram of the semiconductor structure along the first direction X in the step of "forming a fourth insulating layer 300 on the surface of the thin-film stack structure 120"; and FIG. 26 typically illustrates a schematic structural diagram of the semiconductor structure along the second direction Y in the above step.

In one embodiment of the present disclosure, for the step of "forming a fourth insulating layer 300 on the surface of the thin-film stack structure 120" in the present disclosure, an insulating material is deposited onto the surface of the thin-film stack structure 120 (i.e., the surface of the dielectric layer 126), and the insulating material covers the surface of the thin-film stack structure 120 and fills up the second groove G2. In this way, the fourth insulating layer 300 is formed, which covers the thin-film stack structure 120 and fills up the second groove G2. Hereby, the fourth insulating layer 300 can provide an insulation function between adjacent two of the write transistors 130, and can provide an insulation function between the thin-film stack structure 120 and other semiconductor film layers formed on the thin-film stack structure 120 in subsequent processes.

In one embodiment of the present disclosure, the insulating material for forming the fourth insulating layer 300 may include silicon oxide.

As shown in FIGS. 27 to 30, in one embodiment of the present disclosure, Step S4 may include following steps:

forming a first via V1 on the surface of the thin-film stack structure 120 (the fourth insulating layer 300), the write transistor 130 being exposed to the first via V1; and forming a storage node 200 in the first via V1.

Figure 27:
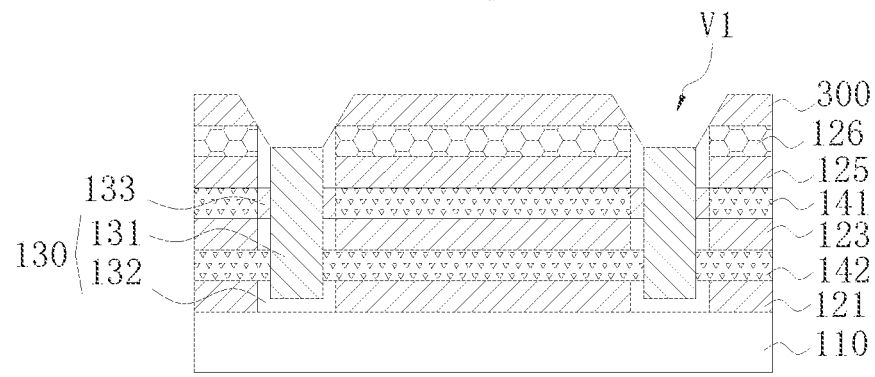
Figure 28:
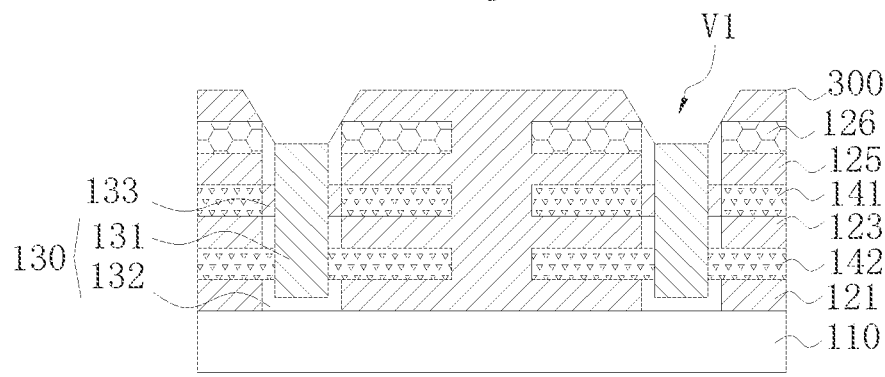

As shown in FIG. 27 and FIG. 28, FIG. 27 typically illustrates a schematic structural diagram of the semiconductor structure along the first direction X in the step of "forming a first via V1 on the surface of the thin-film stack structure 120"; and FIG. 28 typically illustrates a schematic structural diagram of the semiconductor structure along the second direction Y in the above step.

In one embodiment of the present disclosure, for the step of "forming a first via V1 on the surface of the thin-film stack structure 120" in the present disclosure, the first via V1 is formed on the surface of the fourth insulating layer 300. A top of the first via V1 is opened on the surface of the fourth insulating layer 300, a bottom of the first via V1 is stopped on the write transistor 130, and a top of the write transistor 130 may be partially removed during the formation of the first via V1. That is, a top surface of rest of the write transistor 130 defines a bottom wall of the first via V1, and the write transistor 130 is exposed to the bottom of the first via V1.

As shown in FIG. 27 and FIG. 28, in one embodiment of the present disclosure, after the write transistor 130 is partially removed during the formation of the first via V1, a height of the top surface of rest of the write transistor 130 may fall inside the dielectric layer 126. That is, the top surface of rest of the write transistor 130 may be lower than the top surface of the dielectric layer 126 and higher than the bottom surface of the dielectric layer 126.

Figure 29:
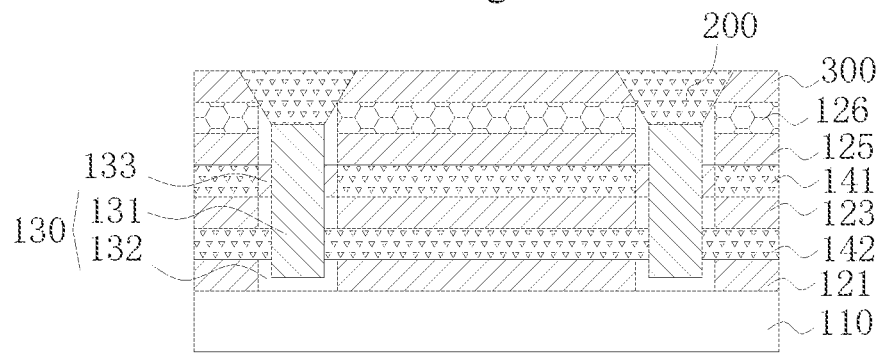
Figure 30:
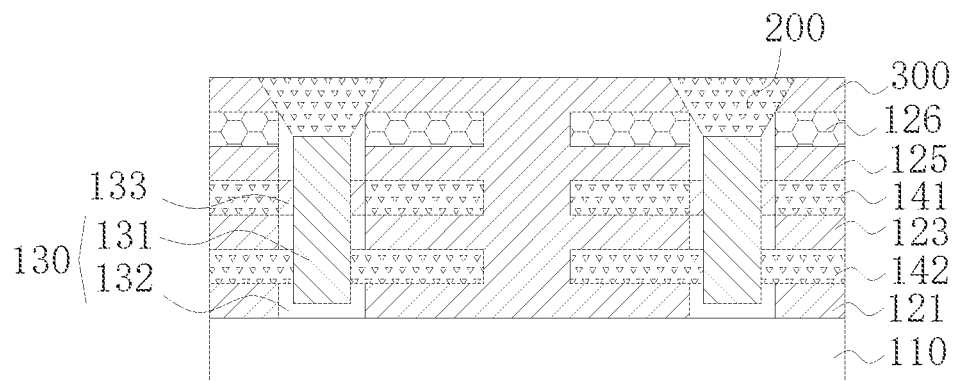

As shown in FIG. 29 and FIG. 30, FIG. 29 typically illustrates a schematic structural diagram of the semiconductor structure along the first direction X in the step of "forming a storage node 200 in the first via V1; and FIG. 30 typically illustrates a schematic structural diagram of the semiconductor structure along the second direction Y in the above step.

In one embodiment of the present disclosure, for the step of "forming a first via V1 on the surface of the thin-film stack structure 120" in the present disclosure, a conductive material is deposited into the first via V1 to form the storage node 200 (i.e., SN junction). A top of the storage node 200 is exposed to the surface of the fourth insulating layer 300, and a bottom of the storage node 200 is in contact with the write transistor 130. During the deposition of the above-mentioned conductive material, the conductive material may cover the surface of the fourth insulating layer 300 and fill up the first via V1. On this basis, after the deposition of the conductive material is completed, the conductive material covering the surface of the fourth insulating layer 300 may be removed by means of but not limited to, for example, an etch back process. Hereby, rest of the conductive material is filled into the first via V1, thereby forming the storage node 200.

As shown in FIGS. 31 to 35, in one embodiment of the present disclosure, Step S5 may include following steps:

after the step of forming a storage node 200 (i.e., Step S4), forming a second gate oxide layer 400 and a second channel layer 500 stacked in sequence from bottom to top over the thin-film stack structure 120;

forming a fifth insulating layer 600 over the second channel layer 500;

forming a third groove G3 in the fifth insulating layer 600, the third groove G3 extending along the second direction Y; and forming a second source S2 and a second drain D2 by doping a part of the second channel layer 500 exposed by means of the third groove G3, to form the read transistor 700.

Figure 31:
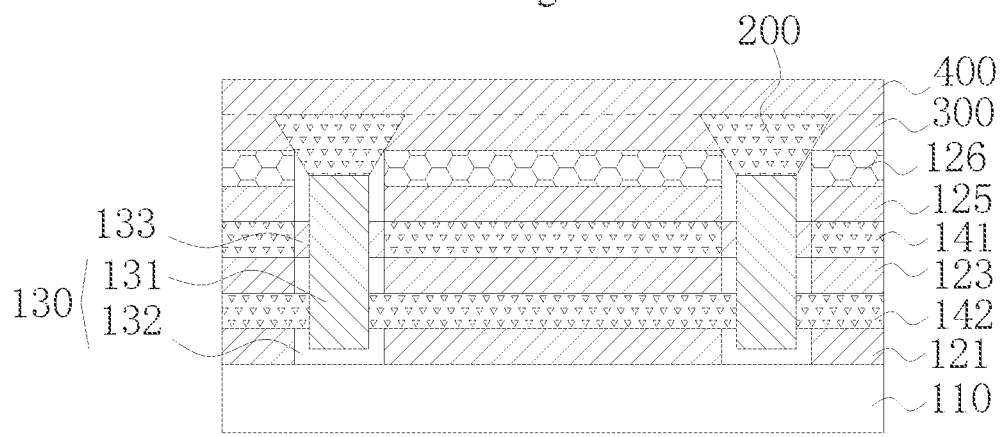
Figure 32:
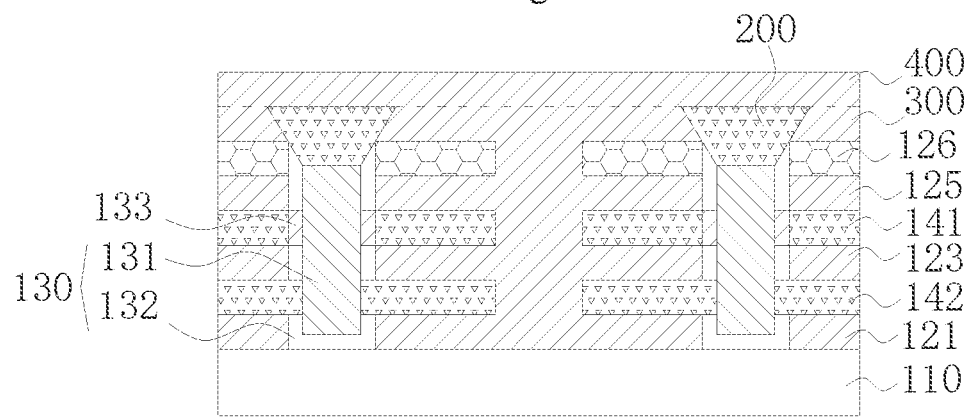

As shown in FIG. 31 and FIG. 32, FIG. 31 typically illustrates a schematic structural diagram of the semiconductor structure along the first direction X in the step of "forming a second gate oxide layer 400 over the thin-film stack structure 120"; and FIG. 32 typically illustrates a schematic structural diagram of the semiconductor structure along the second direction Y in the above step.

In one embodiment of the present disclosure, for the step of "forming a second gate oxide layer 400 over the thin-film stack structure 120" in the present disclosure, an insulating material is deposited onto the surface of the thin-film stack structure 120 (i.e., the surface of the fourth insulating layer 300), thereby forming the second gate oxide layer 400 covering the thin-film stack structure 120 and the storage node 200.

In one embodiment of the present disclosure, a material of the second gate oxide layer 400 may include silicon oxide.

In addition, the material of the second gate oxide layer 400 may be the same as that of the first gate oxide layer 131, but not limited thereto.

Figure 33:
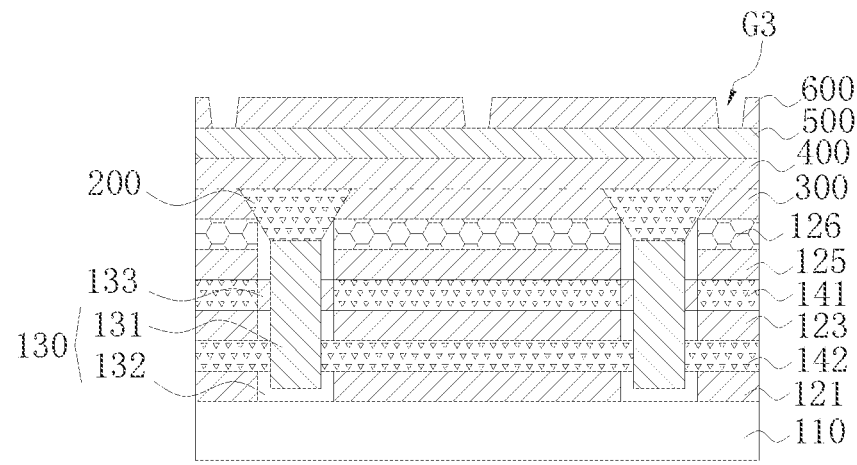
Figure 34:
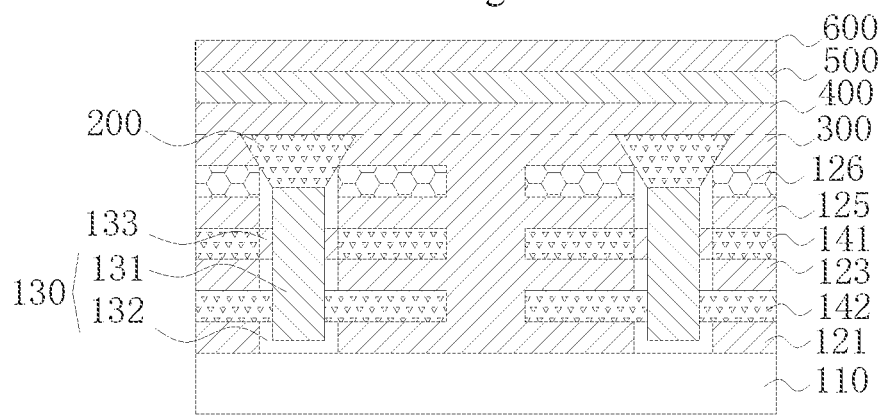

As shown in FIG. 33 and FIG. 34, FIG. 33 typically illustrates a schematic structural diagram of the semiconductor structure along the first direction X in the step of "forming a second channel layer 500 and a fifth insulating layer 600 on the surface of the second gate oxide layer 400" and the step of "forming a third groove G3 in the fifth insulating layer 600"; and FIG. 34 typically illustrates a schematic structural diagram of the semiconductor structure along the second direction Y in the above steps.

In one embodiment of the present disclosure, for the step of "forming a second channel layer 500 and a fifth insulating layer 600 in sequence on the surface of the second gate oxide layer 400" and the step of "forming a third groove G3 in the fifth insulating layer 600, the third groove G3 extending along the second direction Y" in the present disclosure, the second channel layer 500 is formed on the surface of the second gate oxide layer 400, and then the fifth insulating layer 600 is formed on the surface of the second channel layer 500. On this basis, the third groove G3 is opened on the fifth insulating layer 600, a top of the third groove G3 is opened on the surface of the fifth insulating layer 600, and a bottom of the third groove G3 is stopped on the second channel layer 500. That is, the second channel layer 500 is partially exposed to the bottom of the third groove G3, and the exposed part of the surface of the second channel layer 500 defines a bottom wall of the third groove G3.

In one embodiment of the present disclosure, a material of the second channel layer 500 may include metal oxide such as, but not limited to, IGZO.

Figure 35:
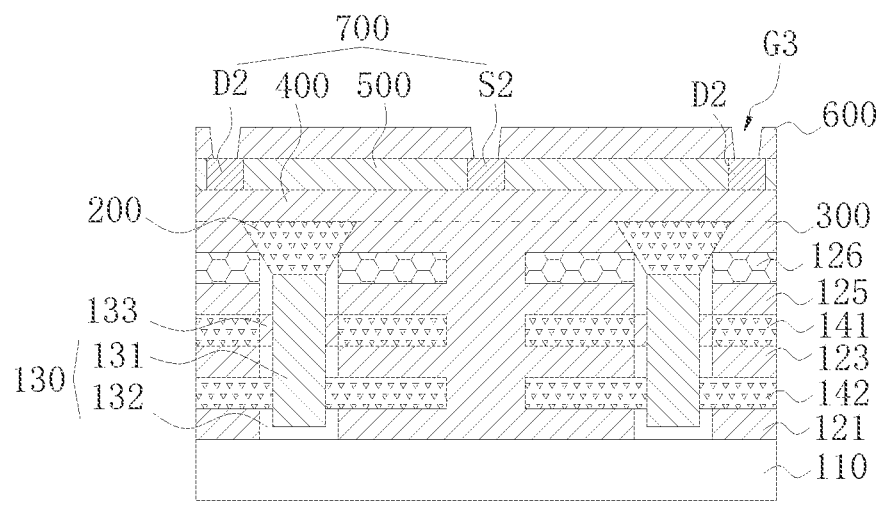

As shown in FIG. 35, FIG. 35 typically illustrates a schematic cross-sectional view of the semiconductor structure along the first direction X in the step of "forming a second source and a second drain by doping a part of the second channel layer exposed by means of the third groove".

In one embodiment of the present disclosure, the third groove G3 is formed in the fifth insulating layer 600, and the third groove G3 extends along the second direction Y. At this moment, the third groove G3 exposes a part of the second channel layer 500. That is, the bottom of the third groove G3 is the upper surface of the second channel layer 500. On this basis, by using the fifth insulating layer 600 for forming the third groove G3 as mask layer, the part of the second channel layer 500 exposed through the third groove G3 is doped by means of ion implantation to form the second source S2 and the second drain D2, such that the read transistor 700 is formed.

As shown in FIGS. 36 to FIG. 40, in one embodiment of the present disclosure, Step S6 may include following steps:

depositing a conductive material into the third groove G3 to form a read bit line 720 and a lead 730; and forming an isolation layer 800 on the surface of the fifth insulating layer 600, the isolation layer 800 covering the read bit line 720 and the lead 730.

Figure 38:
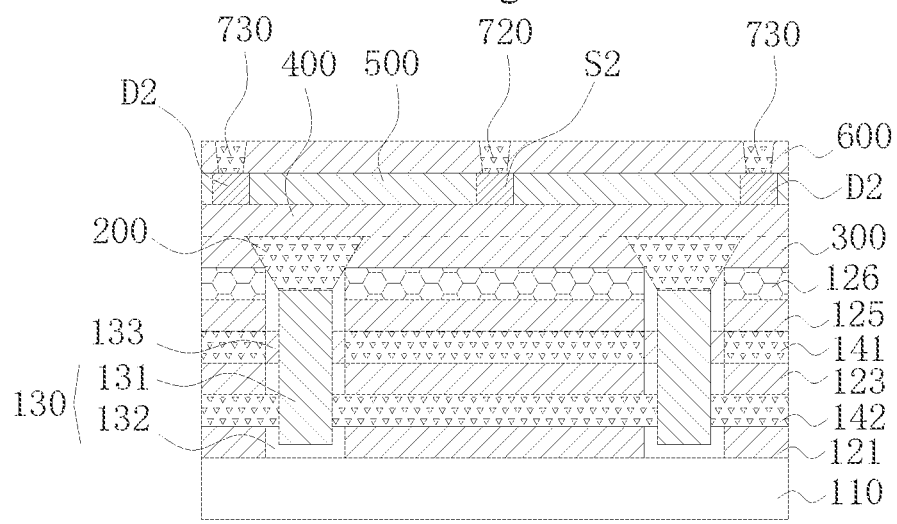

As shown in FIG. 38, FIG. 38 typically illustrates a schematic cross-sectional view of the semiconductor structure along the first direction X in the step of "forming a read bit line 720 and a lead 730 in the third groove G3".

Figure 36:
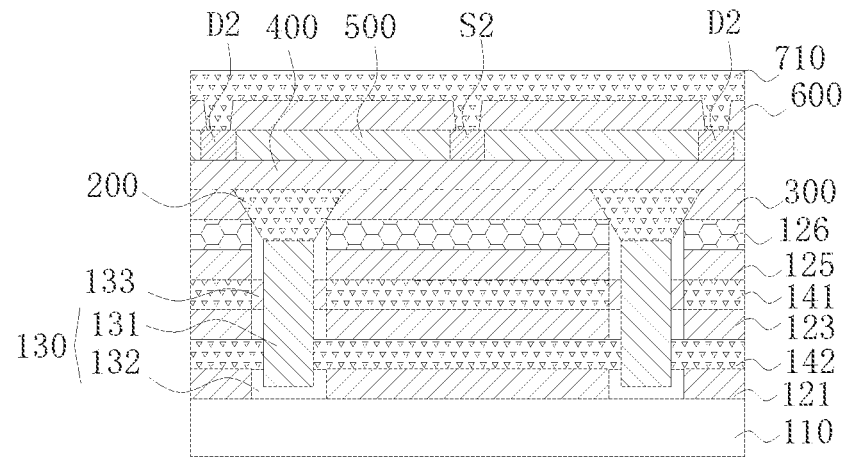
Figure 37:
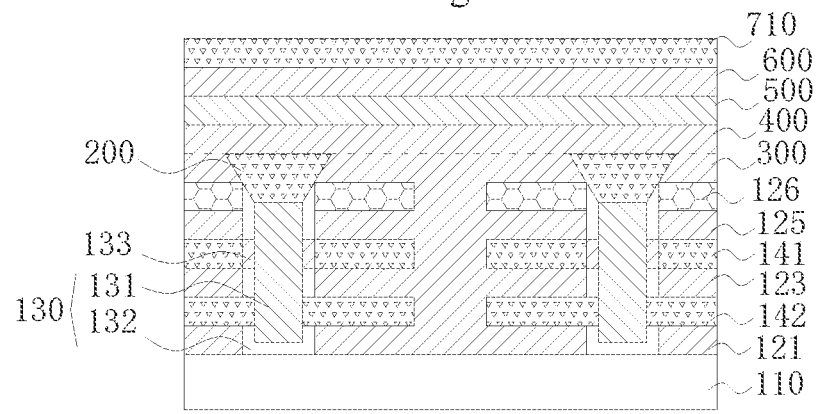
Figure 39:
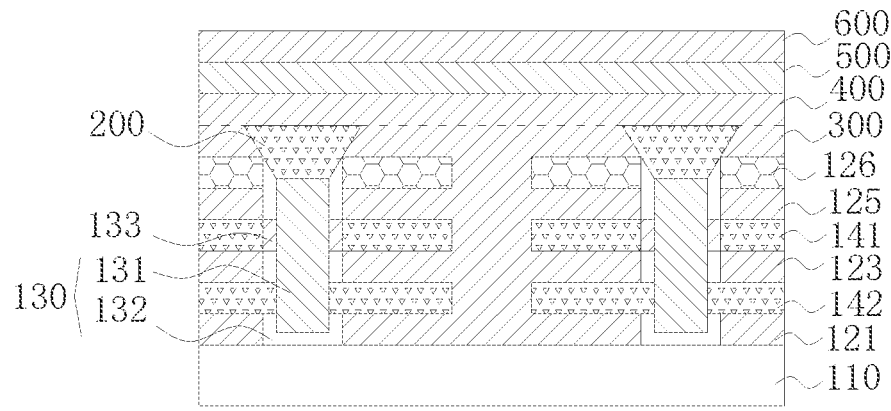

In one embodiment of the present disclosure, for the step of "forming a read bit line 720 and a lead 730 in the third groove G3" in the present disclosure, a conductive material 710 is deposited into the third groove G3 to form the read bit line 720 and the lead 730. The conductive material 710 is also deposited onto the surface of the fifth insulating layer 600, as shown in FIG. 36 and FIG. 37. On this basis, as shown in FIGS. 38 and 39, after the deposition of the conductive material 710 is completed, the conductive material 710 covering the surface of the fifth insulating layer 600 may be removed by means of but not limited to, for example, chemical mechanical polishing. Hereby, rest of the conductive material 710 is filled into the third groove G3, thereby forming the read bit line 720 and the lead 730. A top surface of the read bit line 720 and a top surface of the lead 730 are flush with the surface of the fifth insulating layer 600, and a bottom of the read bit line 720 and a bottom of the lead 730 are in contact with the second channel layer 500.

Figure 40:
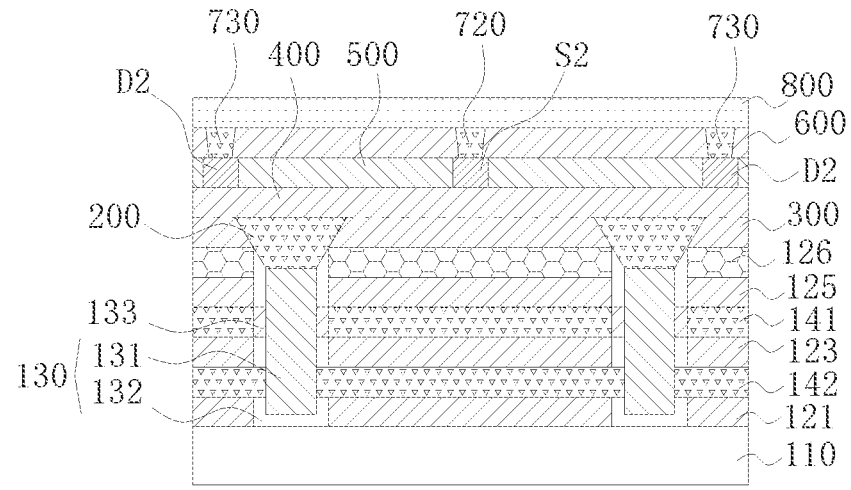
Figure 41:
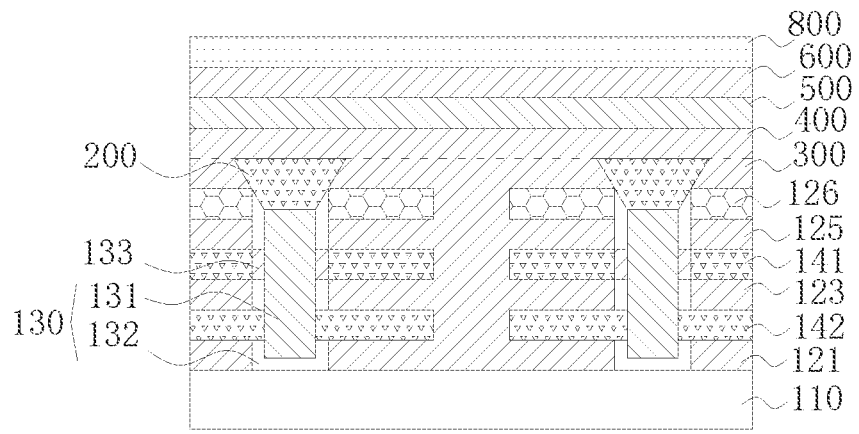

As shown in FIG. 40 and FIG. 41, FIG. 40 typically illustrates a schematic structural diagram of the semiconductor structure along the first direction X in the step of "forming an isolation layer 800 on the surface of the fifth insulating layer 600"; and FIG. 41 typically illustrates a schematic structural diagram of the semiconductor structure along the second direction Y in the above step.

In one embodiment of the present disclosure, for the step of "forming an isolation layer 800 on the surface of the fifth insulating layer 600" in the present disclosure, an isolation material is deposited onto the surface of the fifth insulating layer 600 to form the isolation layer 800 covering the fifth insulating layer 600, the read bit line 720, and the lead 730.

In one embodiment of the present disclosure, the isolation material for forming the isolation layer 800 may include silicon nitride.

Figure 42:
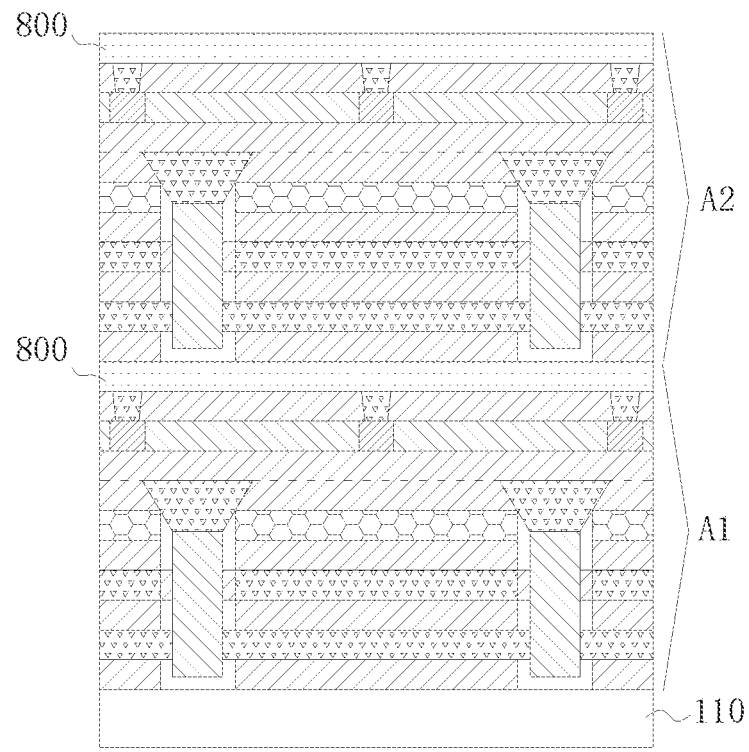
Figure 43:
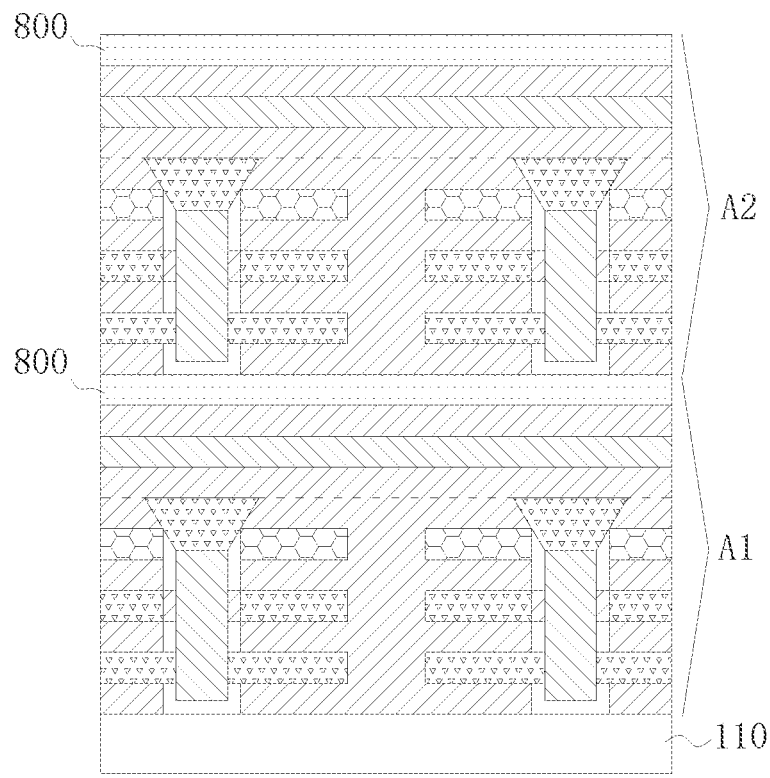

In one embodiment of the present disclosure, the above Steps S1 to S6 are performed on the surface of the isolation layer 800 of a layer of semiconductor structure A1 again, thereby fabricating a second layer of semiconductor structure A2 (as shown in FIG. 42 and FIG. 43). During the fabrication processes of the second layer of semiconductor structure, the formation of the substrate 110 may not include the silicon substrate 110. That is, in two adjacent layers of semiconductor structure, the thin-film stack structure 120 (i.e., the first insulating layer 121) of the semiconductor structure in an upper layer is formed on the isolation layer 800 of the semiconductor structure in a lower layer. In other words, the substrate 110 of each layer of semiconductor structure may be understood as not including the silicon substrate 110, instead at least two layers of semiconductor structures stacked on the silicon substrate 110.

It is to be noted that in some embodiments, the method for fabricating a semiconductor structure provided by the present disclosure not only may also be configured for fabricating a memory including only two layers of semiconductor structure, but also may also be configured for fabricating a memory including four or more layers of semiconductor structure. In other words, in various possible embodiments consistent with the design concept of the present disclosure, the method for fabricating a semiconductor structure proposed in the present disclosure may be configured for fabricating a memory including at least two stacked layers of semiconductor structure.

It is to be noted here that the method for fabricating a semiconductor structure shown in the drawings and described in this specification is only a few examples in methods for fabricating various semiconductor structures that can employ the principles of the present disclosure. It is to be clearly understood that the principles of the present disclosure are in no way limited to any details or steps of the method for fabricating a semiconductor structure illustrated in the drawings or described in this specification.

The method for fabricating a semiconductor structure proposed in the present disclosure is described in detail based on the above several exemplary embodiments.

The semiconductor structure proposed in the present disclosure is described by taking a DRAM having an ultra-high storage density as an example. It is readily comprehensible to those skilled in the art to apply relevant design of the present disclosure to other types of semiconductor structures, various modifications, additions, substitutions, deletions or other variations are made to the following embodiments, and these variations still fall within the scope of the principle of the semiconductor structure proposed in the present disclosure.

In some embodiments, it may be understood in conjunction with the above-mentioned semiconductor structure, during a write process, a positive voltage may be applied to the write bit line and the write word line to charge the storage node by means of conduction of the write transistor, such that the storage node stores a certain quantity of electric charge. During a read process, a negative voltage is applied to the write word line, and a voltage across the write bit line is zero to disable the write transistor. When the electric charge stored on the storage node is enough to enable the read transistor, at this moment, change of current may be read by means of the read bit line. When the electric charge stored on the storage node is not enough to enable the read transistor, at this moment, the change of current cannot be read by means of the read bit line. In this way, write and read of different signals can be implemented.

It is to be noted here that the semiconductor structures illustrated in the drawings and described in this specification are merely a few examples of various semiconductor structures that can employ the principles of the present disclosure. It is to be clearly understood that the principles of the present disclosure are in no way limited to any details or components of the semiconductor structure illustrated in the drawings or described in this specification.

To sum up, the semiconductor structure fabricated in the present disclosure realizes a 2T0C DRAM structure. Compared with an existing 1T1C DRAM structure, the present disclosure can achieve maximization of the storage density by means of the capacitor-free semiconductor structure.

Although description of the present disclosure is made in reference to a plurality of typical embodiments, it shall be understood that terms used herein are exemplary and explanatory only and are not restrictive. The present disclosure can be implemented in various forms without departing from spirit or substance of the present disclosure. Therefore, it shall be understood that the above embodiments are not limited to any foregoing detail, but shall be extensively interpreted within the spirit and scope as defined in the appended claims. Thus, All variations and modifications falling within the claims or equivalent scope thereof shall be covered with the appended claims.

What is claimed is:

1. A method for fabricating a semiconductor structure, comprising
    providing a substrate, a thin-film stack structure being formed on the substrate;
    forming a first groove and a second groove in the thin-film stack structure, and forming write transistors in the first groove, the second groove extending along a first direction, and the second groove being positioned between adjacent two of the write transistors in a second direction;
    removing a part of the thin-film stack structure by etching using the second groove to form a first hole and a second hole respectively, forming a write word line in the first hole, and forming a write bit line in the second hole;
    forming a first via on an upper surface of the thin-film stack structure, the write transistor being exposed to a bottom of the first via, and forming a storage node in the first via;
    forming a read transistor over the thin-film stack structure; and
    forming a read bit line and a lead over the read transistor to obtain the semiconductor structure.

2. The method for fabricating a semiconductor structure according to claim 1, wherein the forming a thin-film stack structure comprises forming a first insulating layer, a first sacrificial layer, a second insulating layer, a second sacrificial layer, a third insulating layer and a dielectric layer in sequence on the substrate.

3. The method for fabricating a semiconductor structure according to claim 2, wherein the removing a part of the thin-film stack structure by etching using the second groove to form a first hole comprises removing the second sacrificial layer by etching to form the first hole.

4. The method for fabricating a semiconductor structure according to claim 2, wherein the removing a part of the thin-film stack structure by etching using the second groove to form a second hole comprises removing the first sacrificial layer by etching to form the second hole.

5. The method for fabricating a semiconductor structure according to claim 2, wherein the forming write transistors in the first groove comprises:
    forming a barrier layer on a sidewall and a bottom wall of the first groove;
    forming a first channel layer in the first groove; and
    jointly constituting, by the barrier layer and the first channel layer, the write transistor.

6. The method for fabricating a semiconductor structure according to claim 5, wherein the forming a write word line in the first hole comprises:
    exposing a part of the barrier layer from the first hole;
    oxidizing the exposed barrier layer to form a first gate oxide layer; and
    forming the write word line in the first hole by means of the second groove.

7. The method for fabricating a semiconductor structure according to claim 6,
    wherein in a direction perpendicular to the substrate, a width size of the first gate oxide layer is greater than or equal to a width size of the first hole.

8. The method for fabricating a semiconductor structure according to claim 6, wherein the forming a write word line in the first hole further comprises:
    filling a conductive material into the first hole and the second groove, the conductive material further covering a surface of the thin-film stack structure; and
    removing the conductive material filled into the second groove and covered on the surface of the thin-film stack structure, rest of the conductive material in the first hole forming the write word line.

9. The method for fabricating a semiconductor structure according to claim 5, wherein the forming a write bit line in the second hole comprises:
    removing a part of the barrier layer exposed to the second hole by etching by means of the second hole, to expose a part of the first channel layer; and
    forming the write bit line in the second hole, the write bit line being in contact with the first channel layer.

10. The method for fabricating a semiconductor structure according to claim 9, wherein the forming a write bit line in the second hole comprises:

filling a conductive material into the second hole and the second groove, the conductive material further covering a surface of the thin-film stack structure; and
removing the conductive material filled into the second groove and covered on the surface of the thin-film stack structure, rest of the conductive material in the second hole forming the write bit line.

11. The method for fabricating a semiconductor structure according to claim 5, wherein a material of the barrier layer is different from a material of the second sacrificial layer.

12. The method for fabricating a semiconductor structure according to claim 5, wherein a material of the first channel layer comprises a metal oxide.

13. The method for fabricating a semiconductor structure according to claim 1, wherein before the forming a first via on a surface of the thin-film stack structure, the method further comprises:

forming a fourth insulating layer on the surface of the thin-film stack structure, the fourth insulating layer being filled into the second groove;
wherein a top of the first via is opened on a surface of the fourth insulating layer.

14. The method for fabricating a semiconductor structure according to claim 1, wherein the read transistor comprises a second source and a second drain, the forming a read transistor over the thin-film stack structure comprises:

after the storage node is formed, forming a second gate oxide layer and a second channel layer stacked in sequence from bottom to top over the thin-film stack structure;
forming a fifth insulating layer over the second channel layer;
forming a third groove in the fifth insulating layer, the third groove extending along the second direction; and
forming the second source and the second drain by doping a part of the second channel layer exposed by means of the third groove, to form the read transistor.

15. The method for fabricating a semiconductor structure according to claim 14, wherein the forming a read bit line and a lead over the read transistor comprises:

depositing a conductive material in the third groove to form the second source and the second drain; and
forming an isolation layer on a surface of the fifth insulating layer, the isolation layer covering the second source and the second drain.

\* \* \* \* \*